(12) United States Patent
Liu

(10) Patent No.: US 10,932,381 B1
(45) Date of Patent: Feb. 23, 2021

(54) DISPLAY PANEL SUPPORT FRAME AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Lang Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/733,024

(22) PCT Filed: Mar. 24, 2020

(86) PCT No.: PCT/CN2020/080780
§ 371 (c)(1),
(2) Date: Apr. 21, 2020

(30) Foreign Application Priority Data

Dec. 31, 2019 (CN) .......................... 201911406880.1

(51) Int. Cl.
*H01M 50/20* (2021.01)
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 9,535,452 B2* | 1/2017 | Ahn | H05K 5/0017 |
| 10,394,062 B1 | 8/2019 | Song | |
| 2013/0021762 A1* | 1/2013 | van Dijk | H05K 5/0226 361/749 |
| 2014/0213324 A1* | 7/2014 | Tan | G06F 1/1677 455/566 |
| 2016/0085271 A1* | 3/2016 | Morrison | G06F 1/1652 361/679.27 |
| 2016/0135324 A1 | 5/2016 | Lee et al. | |
| 2016/0143162 A1 | 5/2016 | Van Dijk et al. | |
| 2016/0302314 A1* | 10/2016 | Bae | G06F 1/16 |
| 2018/0110139 A1* | 4/2018 | Seo | H04M 1/0216 |
| 2018/0210511 A1 | 7/2018 | Lin | |

(Continued)

FOREIGN PATENT DOCUMENTS

| | | | |
|---|---|---|---|
| CN | 105590558 A | 5/2016 | |
| CN | 106559531 A | 4/2017 | |

(Continued)

*Primary Examiner* — Xanthia C Cunningham

(57) ABSTRACT

A display panel support frame and a display panel are provided. The display panel support frame includes a first support frame, a second support frame, a third support frame, and a plurality of connecting members. The support plate on the first support frame and the second support frame may be relatively displaced from the third support frame through the connecting member of a linking member, thereby reducing the tensile or compressive stress of the non-bending area of the screen.

17 Claims, 3 Drawing Sheets

(56) References Cited

U.S. PATENT DOCUMENTS

2019/0041913 A1    2/2019  Yeh
2019/0179373 A1*  6/2019  Cheng ................... H04M 1/02
2020/0081486 A1    3/2020  Lin

FOREIGN PATENT DOCUMENTS

| CN | 107331302 A | 11/2017 |
|----|-------------|---------|
| CN | 108776508 A | 11/2018 |
| CN | 108965505 A | 12/2018 |
| CN | 109887417 A | 6/2019  |
| CN | 110007715 A | 7/2019  |
| CN | 110085129 A | 8/2019  |
| CN | 209674772 U | 11/2019 |
| CN | 110544428 A | 12/2019 |
| CN | 209767998 U | 12/2019 |

\* cited by examiner

DISPLAY PANEL SUPPORT FRAME AND DISPLAY DEVICE

BACKGROUND OF INVENTION

Field of Invention

The present invention relates to the field of display technology, and more particularly, to a display panel support frame and a display device.

Description of Prior Art

Currently, the panel industry is accompanied by the large-scale production and use of organic light-emitting semiconductor (OLED) flexible screens. Mobile terminals, such as foldable screen phones and tablets have become a major trend. They have a significant advantage of a larger display area without taking up more storage space. However, there is always a problem with foldable screens. In the process of changing from a bending state to a non-bending state of the screens, the non-bending part of the screens must have a stretching deformation, and this part must be connected to a middle frame. This connection may limit the deformation of the flexible screen and cause stress that damages the screens.

In the prior art, the above-mentioned problems are generally solved by using a plurality of springs between screen support plate and middle frame to make a relative displacement between therein. However, there are some disadvantages in the springs, such as the springs are prone to failure, a durability of the springs is not well, and each of the springs have different elastic coefficients springs, etc.

Therefore, it is necessary to provide a display panel support frame and a display device for a display panel to protect a flexible display screen.

SUMMARY OF INVENTION

The object of the present invention is to provide a display panel support frame and a display device, which may reduce the tensile or compression stress and the strain generated in the non-bending area of the display screen, thereby protecting the flexible display screen.

A display panel support frame comprises a first support frame, a second support frame, a third support frame, and at least two connecting members. One side of the third support frame is rotatably connected to the first support frame, and another side of the third support frame is rotatably connected to the second support frame. The first support frame and the second support frame have a same structure, and each comprises a support plate disposed thereon. One of the connecting members makes the support plate on the first support frame slidably connect to the third support frame, and another connecting member makes the support plate on the second support frame slidably connects to the third support frame.

In one embodiment, each of the two connecting members comprises a linking member, and the linking member comprises a first fixed shaft connected to the support plate; a second fixed shaft connected to the connecting member; a rotation shaft rotated around the first fixed shaft; a first connecting link connecting the first fixed shaft to the rotation shaft; and a second connecting link connecting the second fixed shaft to the rotation shaft.

In one embodiment, the connecting member further comprises a base body, and the second fixed shaft of the linking member is disposed on the base body.

In one embodiment, the connecting member further comprises a connecting shaft, the connecting shaft is disposed on one side of the base body, and the connecting shaft connects the connecting member to the third support frame.

In one embodiment, the display panel support frame further comprises at least one notch formed on each side of the third support frame. The at least one notch is correspondingly configured with the connecting shaft of the connecting member, and the two connecting members are fixed to two sides of the third support frame through the connecting shaft and the notch corresponding to the connecting shaft.

In one embodiment, the display panel further comprises a slide rail is formed on a bottom of the support plate. The connecting member is slidably connected to the slide rail; the second fixed shaft is fixed to an upper surface of the slide rail; and the rotation shaft, the first connecting link, and the second connecting link are configured to move in the slide rail.

In one embodiment, the support plate comprises a first portion and a second portion, the first portion is connected to the second portion, and the slide rail is formed on a bottom surface of the second portion.

In one embodiment, a gap is formed between the first portion and the second portion, and the gap provides the second portion slides with a space for sliding left and right.

A display device comprises a display panel support frame and a display panel, and the display panel is disposed on the display panel support frame.

In one embodiment, the display panel comprises a bending portion and a non-bending portion, the bending portion corresponds to the third support frame, and the non-bending portion corresponds to the first support frame and the second support frame.

A display panel support frame and a display device are provided. The support plate and the third support frame are relatively displaced by using a connecting member having a linking member, which may reduce the tensile or compression stress and the strain generated in the non-bending area of the display screen. Specifically, the support plate fixes the first fixed shaft, and the connection plate fixes the second fixed shaft. When the display panel support frame starts to fold, the support plate and the third support frame move relative to each other through the connecting member, thereby driving the rotation shaft to rotate around the first fixed shaft, and driving the first connecting link and the second connecting link to move together. Therefore, the damping produced by the linking member will protect the display screen, and no excessive tensile or compressive stress are happened, and the flexible screen is protected well.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Figure 1:
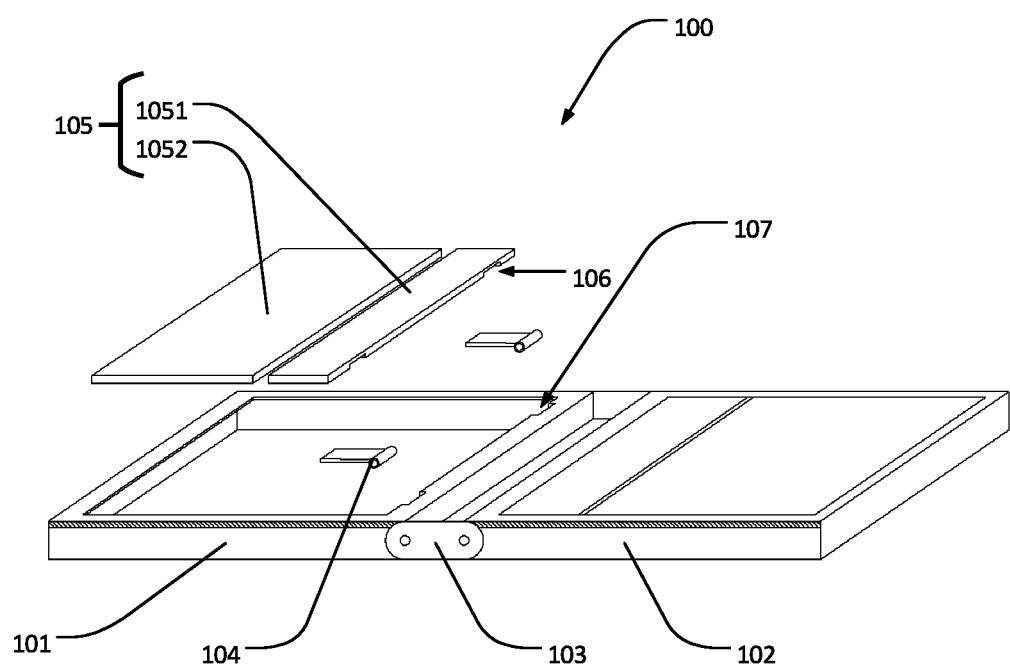
FIG. 1 is a schematic structural view of a display panel support frame according to one embodiment of the present invention.

REFERENCE NUMERALS display panel support frame 100; display device 200; first support frame 101; second support frame 102; third support frame 103; connecting member 104; support plate 105; slide rail 106; first portion 1051; second portion 1052; rotation shaft 1042; first connecting link 1044; second connecting link 1045; first fixed shaft 1041; second fixed shaft 1043; display panel 201; and bending portion 10.

DETAILED DESCRIPTION OF PREFERRED EMBODIMENTS

Embodiments of the present invention will be described in detail herein with reference to the accompanying drawings. The present invention may be carried out in many different forms and should not be construed as being limited to the specific embodiments set forth herein. The embodiments of the present invention are provided to explain the practical application of the present invention, so that those skilled persons in the art may understand various embodiments of the present invention and various modifications suitable for a specific intended application.

Referring to FIG. 1, a display panel support frame 100 is provided and comprises a first support frame 101, a second support frame 102, a third support frame 103, and at least two connecting members 104.

One side of the third support frame 103 is rotatably connected to the first support frame 101, and another side of the third support frame 103 is rotatably connected to the second support frame 102. That is, the first support frame 101 and the second support frame 102 are disposed at left side and right side of the third support frame 103.

The first support frame 102 and the second support frame 102 have a same structure, and each comprises a support plate 105 is disposed thereon.

One of the connecting members makes the support plate 105 on the first support frame 101 slidably connect to the third support frame 103, and another connecting member makes the support plate 102 on the second support frame 102 slidably connects to the third support frame 103.

There are at least two connecting members 104 in one embodiment of the present invention. In another embodiment, there are more connecting members 104 that make the support plate 105 connect to the third support frame 103. For example, referring to FIG. 2, two connecting members 104 make left support plate 105 connect to the third support frame 103. Similarly, right support plate 105 is connected to right side of the third support frame 103 by using another two connecting members 104. It may be known that the present invention does not limit the number of the connecting members 104.

Referring to FIG. 1, a slide rail 106 is formed on a bottom of the support plate 105.

Figure 2:
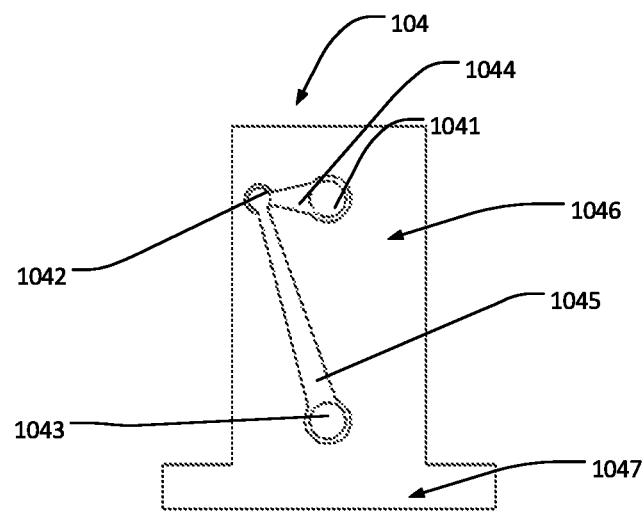
FIG. 2 is a schematic structural view of a connecting member according to one embodiment of the present invention.

Referring to FIG. 2, each of connecting members 104 comprises a base body 1046 and a linking member disposed on the base body 1046, and the base body 1046 has a flat shape and the link member is disposed on an upper surface of the base body 1046. The linking member comprises a first fixed shaft 1041, a second fixed shaft 1043, a rotation shaft 1042, a first connecting link 1044, and a second connecting link 1045.

The first fixed shaft 1041 is connected to the support plate 105. It should be noted that "connected" here is used to explain the relationship between the first fixed shaft 1041 and the support plate 105, that is, the first fixed shaft 1041 and the support plate 105 are connected. In other words, the first fixed shaft 1041 may be fixed or assembled on the support plate 105 as a separate component, or directly formed on the support plate 105 to form an integrated structure. Alternatively, the first fixed shaft 1041 may be disposed on the support plate 105 by other means. For example, in one embodiment, the first fixed shaft 1041 is assembled into the corresponding slide rail 106 of the support plate 105.

The second fixed shaft 1043 is connected to the connecting member 104. It should be noted that "connected" here is used to explain the relationship between the second fixed shaft 1043 and the connecting member 104, that is, the second fixed shaft 1043 and the connecting member 104 are connected. In other words, the second fixed shaft 1043 may be fixed or assembled on the connecting member 104 as a separate component, or directly formed on the connecting member 104 to form an integrated structure. Alternatively, the second fixed shaft 1043 may be disposed on the connecting member 104 by other means.

The rotation shaft 1042 is rotated around the first fixed shaft 1041.

A first connecting link 1044 connects the first fixed shaft 1041 to the rotation shaft 1042.

A second connecting link 1045 connects the second fixed shaft 1043 and the rotation shaft 1042.

In one embodiment, the second fixed shaft 1043 is fixed on the upper surface of the connecting member 104. All of the rotation shaft 1042, the first connecting link 1044, and the second connecting link 1045 may move in the slide rail 106.

The base body 1046 further comprises a connecting shaft 1047. The connecting shaft 1047 is disposed on one side of the base body 1046. The connecting shaft 1047 is configured to connect the connecting member 104 to the third support frame.

At least one notch 107 is formed on each side of the third support frame 103. The at least one notch is correspondingly configured with the connecting shaft 1047 of the connecting member 104, and the two connecting members 104 are fixed to two sides of the third support frame 103 through the connecting shaft 1047 and the notch 107 corresponding to the connecting shaft 1047.

One notch 107 is formed on a side of the third support frame 103 close to the first support frame 101. Another slot 107 is formed on a side of the third support frame 103 close to the second support frame 102. That is, at least one notch 107 is formed on both sides of the third support frame 103. In this embodiment, two notches 107 are formed on both sides of the third support frame 103, and the two notches are correspondingly configured with the connecting member 104. In actual production, the number of the notches 107 is determined according to the number of the connecting members 104.

When the display panel support frame 100 is working, the first fixed shaft 1041 of the connecting member 104 is fixed on the support plate 105, and the connecting member 104 is fixedly connected to the third support frame 103. When the display panel supporting frame 100 is folded, the third support frame 103 and the support plate 105 are needed to be folded. At this time, the support plate 105 is folded, the third support frame 103 and the support plate 105 are displaced, and the support plate 105 drives the first fixed shaft 1041 to move together. Also, the support plate 105 drives the rotation shaft of the linking member, the first connecting link, and the second connecting link to move. As a result, the flexible screen is protected in the direction of relative sliding without generating excessive tensile or compressive stress, so as not to cause deformation that damages it.

Referring to FIG. 1, in one embodiment, the support plate 105 comprises a first portion 1051 and a second portion 1052. The first portion 1051 is connected to the second portion 1052, and the slide rail 106 is formed on a bottom surface of the second portion 1052. The second portion 1052 may be stretched and compressed to rotate the linking member.

A gap is formed between the first portion 1051 and the second portion 1052, and the gap provides the second portion 1052 slides with a space for sliding left and right.

Figure 3:
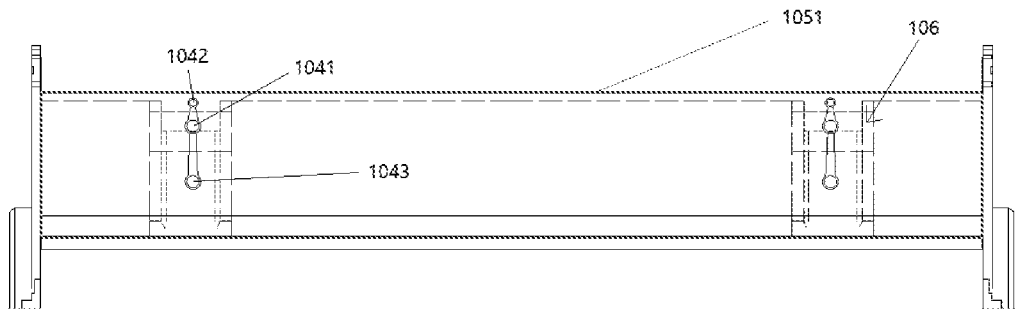
FIG. 3 is a schematic structural view of the display panel support frame in a non-bending state according to one embodiment of the present invention.

Referring to FIG. 3, when a display panel support frame is in a non-bending state, the support plate 105 and the third support frame 103 are pressed against each other. At this time, the linking member is in a folding state, and the first connecting link 1044 and the second connecting link 1045 are overlapped, and the rotation shaft 1042 is rotated directly above them, and the first fixed shaft 1041 is located directly under the rotation shaft 1042.

Figure 4:
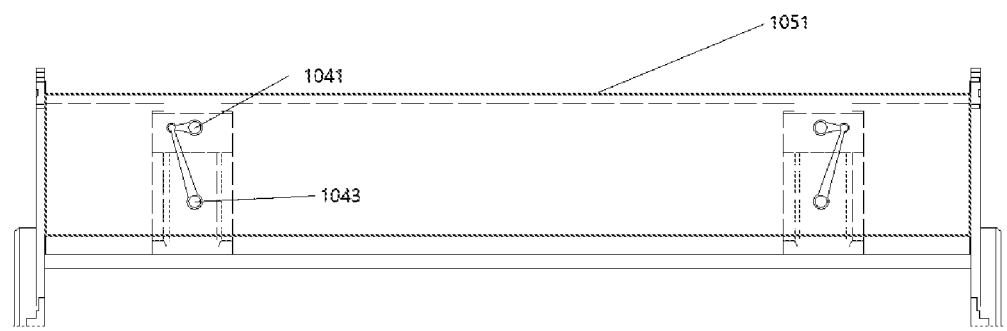
FIG. 4 is a schematic structural view of the display panel support frame provided in a transition state according to one embodiment the present invention.
Figure 5:
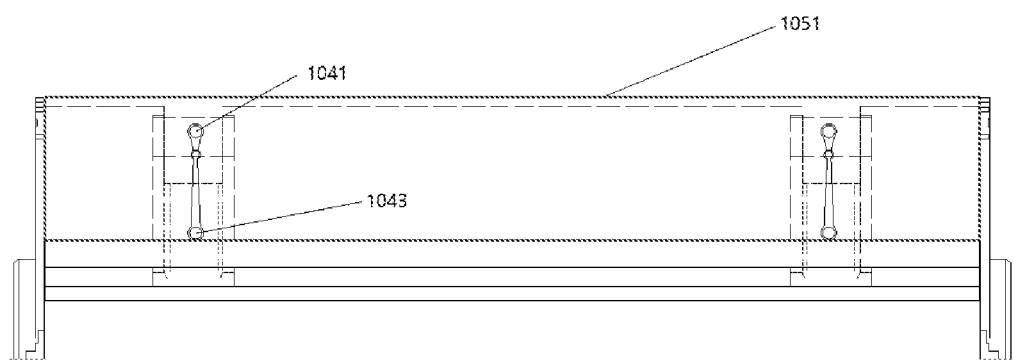
FIG. 5 is a schematic structural view of the display panel support frame in a bending state according to one embodiment of the present invention.

Referring to FIG. 4, when a display panel support frame is in a transition state, the support plate 105 is folded upward, and then moves relative to the connecting member 104 and the third support frame 103. The rotation shaft 1042 slowly moves downward. At this time, the first connecting link 1044 and the second connecting link 1045 forms an included angle. When the display panel support frame is slowly folded, the included angle gradually increases with the relative movement of the linking member until the structure shown in FIG. 5 is formed. The first connecting link and the second connecting link may generate friction with the corresponding shaft, thereby generating a damping effect. The damping effect of the linking member may effectively protect the display screen.

Referring to FIG. 5, a display panel support frame is in a bending state. The first fixed shaft 1041, the rotation shaft 1042, and the second fixed shaft 1043 are on a straight line, and the rotation shaft 1042 is located between the first fixed shaft 1041 and the second fixed shaft 1043.

The display panel support frame is in a folded state, the first fixed shaft 1041, the rotation shaft 1042, and the second fixed shaft 1043 are on a straight line, and the rotation shaft 1042 is located between the first fixed shaft 1041 and the second fixed shaft 1043.

The support plate 105 and the third support frame 103 are pressed against each other. The first fixed shaft 1041 is fixed to the second fixed shaft 1043, and the support plate 105 and the third support frame 103 are relatively moved through the connecting member 104, so that the rotation shaft 1042 of the linking member is moved to a position between the first fixed shaft 1041 and the second fixed shaft 1043.

A display panel support frame is provided. The connecting plate and the third support frame 103 are relatively displaced through the connecting member 104 of the linking member, which may reduce the tensile or compression stress and the strain generated in the non-bending area of the display screen. Specifically, the support plate 105 fixes the first fixed shaft 1041, and the third support frame 103 fixes the second fixed shaft 104. When the display panel support frame starts to fold, the rotation shaft 1042 rotates around the first fixed shaft 1041, Therefore, the damping produced by the linking member will protect the display screen, and no excessive tensile or compressive stress are happened, and the flexible screen is protected well.

Figure 6:
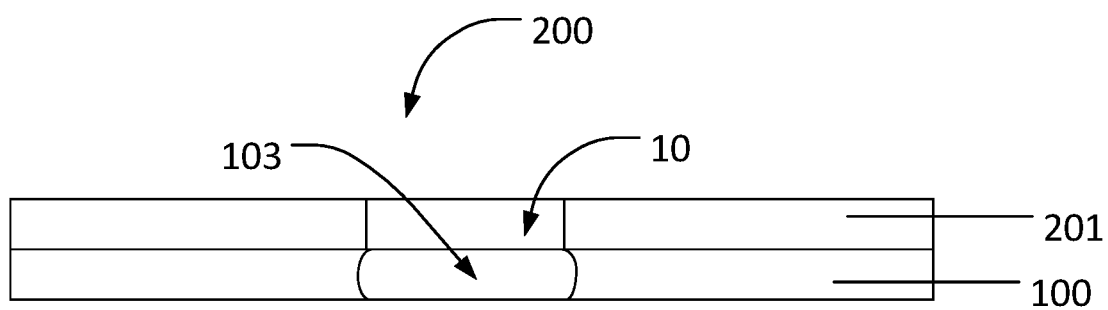
FIG. 6 is a schematic structural view of the display device according to one embodiment of the present invention.

Referring to FIG. 6, a display device 200 is further provided, and the display device 200 comprises a display panel support frame 100 and a display panel 201, and the display panel 201 is disposed on the display panel support frame 100.

The display panel 201 comprises a bending portion 10 and a non-bending portion, the bending portion 10 corresponds to the third support frame 103, and the non-bending portion corresponds to the first support frame 101 and the second support frame 102.

When the support frame is in a non-bending state, the surface of the entire support frame is flat for supporting the display panel 201 and making the surface of the display device 200 flush.

When the display device 200 is folded, the display panel support frame 100 starts to work, and the connecting member 104 and the support plate 105 may relatively slide. Because the connecting member 104 is fixedly connected to the third support frame 103, the third support frame 103 and the support plate 105 may relatively slide. The support plate 105 is fixed to the non-bending portion of the display panel 201, so the non-bending portion of the display panel 201 may relatively slide with the third support frame 103. Therefore, when the support frame is bent and rotated, the display panel 201 is always protected in the direction of relative sliding without being stretched or compressed, and no tensile or compression stress will be generated, so that it will not cause deformation that damages the display panel.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel support frame, comprising a first support frame, a second support frame, a third support frame, and at least two connecting members;
    wherein one side of the third support frame is rotatably connected to the first support frame, and another side of the third support frame is rotatably connected to the second support frame;
    wherein the first support frame and the second support frame have a same structure, and each comprises a support plate disposed thereon; and
    wherein one of the connecting members makes the support plate on the first support frame slidably connect to the third support frame, and another connecting member makes the support plate on the second support frame slidably connects to the third support frame.

2. The display panel support frame according to claim 1, wherein each of the two connecting members comprises a linking member, and the linking member comprises:
   a first fixed shaft connected to the support plate;
   a second fixed shaft connected to the connecting member;
   a rotation shaft rotated around the first fixed shaft;
   a first connecting link connecting the first fixed shaft to the rotation shaft; and
   a second connecting link connecting the second fixed shaft to the rotation shaft.

3. The display panel support frame according to claim 2, wherein the connecting member further comprises a base body, and the second fixed shaft of the linking member is disposed on the base body.

4. The display panel support frame according to claim 3, wherein the connecting member further comprises a connecting shaft, the connecting shaft is disposed on one side of the base body, and the connecting shaft connects the connecting member to the third support frame.

5. The display panel support frame according to claim 4, further comprising at least one notch formed on each side of the third support frame, wherein the at least one notch is correspondingly configured with the connecting shaft of the connecting member, and the two connecting members are fixed to two sides of the third support frame through the connecting shaft and the notch corresponding to the connecting shaft.

6. The display panel support frame according to claim 1, further comprising a slide rail is formed on a bottom of the support plate, wherein the connecting member is slidably connected to the slide rail;
   the second fixed shaft is fixed to an upper surface of the slide rail; and
   the rotation shaft, the first connecting link, and the second connecting link are configured to move in the slide rail.

7. The display panel support frame according to claim 6, wherein the support plate comprises a first portion and a second portion, the first portion is connected to the second portion, and the slide rail is formed on a bottom surface of the second portion.

8. The display panel support frame according to claim 7, wherein a gap is formed between the first portion and the second portion, and the gap provides the second portion slides with a space for sliding left and right.

9. A display device, comprising a display panel support frame and a display panel,
   wherein the display panel is disposed on the display panel support frame;
   wherein the display panel support frame comprises a first support frame, a second support frame, a third support frame, and at least two connecting members;
   wherein one side of the third support frame is rotatably connected to the first support frame, and another side of the third support frame is rotatably connected to the second support frame;
   wherein the first support frame and the second support frame have a same structure and each comprises a support plate disposed thereon; and
   wherein one of the connecting members makes the support plate on the first support frame slidably connect to the third support frame, and another connecting member makes the support plate on the second support frame slidably connects to the third support frame.

10. The display device according to claim 9, wherein each of the two connecting members comprises a linking member, and the linking member comprises:
    a first fixed shaft connected to the support plate;
    a second fixed shaft connected to the connecting member;
    a rotation shaft rotated around the first fixed shaft;
    a first connecting link connecting the first fixed shaft and the rotation shaft; and
    a second connecting link connecting the second fixed shaft and the rotation shaft.

11. The display device according to claim 9, wherein the connecting member further comprises a base body, and the second fixed shaft of the linking member is disposed on the base body.

12. The display device according to claim 11, wherein the connecting member further comprises a connecting shaft, the connecting shaft is disposed on one side of the base body, and the connecting shaft connects the connecting member to the third support frame.

13. The display device according to claim 12, further comprising at least one notch formed on each side of the third support frame, wherein the at least one notch is correspondingly configured with the connecting shaft of the connecting member, and the two connecting members are fixed to two sides of the third support frame through the connecting shaft and the notch corresponding to the connecting shaft.

14. The display device according to claim 9, further comprising a slide rail is formed on a bottom of the support plate, wherein the connecting member is slidably connected to the slide rail;
    the second fixed shaft is fixed to an upper surface of the slide rail; and
    the rotation shaft, the first connecting link, and the second connecting link are configured to move in the slide rail.

15. The display device according to claim 14, wherein the support plate comprises a first portion and a second portion, the first portion is connected to the second portion, and the slide rail is formed on a bottom surface of the second portion.

16. The display device according to claim 15, wherein a gap is formed between the first portion and the second portion, and the gap provides the second portion slides with a space for sliding left and right.

17. The display device according to claim 9, wherein the display panel comprises a bending portion and a non-bending portion, the bending portion corresponds to the third support frame, and the non-bending portion corresponds to the first support frame and the second support frame.

* * * * *